United States Patent [19]
Nakajima

[11] Patent Number: 5,672,890
[45] Date of Patent: Sep. 30, 1997

[54] FIELD EFFECT TRANSISTOR WITH LIGHTLY DOPED DRAIN REGIONS

[75] Inventor: Shigeru Nakajima, Yokohama, Japan

[73] Assignee: Sumitomo Electric Industries, Osaka, Japan

[21] Appl. No.: 527,226

[22] Filed: Sep. 12, 1995

[30]      Foreign Application Priority Data

Sep. 14, 1994 [JP] Japan .................. 6-220161

[51] Int. Cl.⁶ ............ H01L 31/0328; H01L 31/0336; H01L 31/072; H01L 31/109
[52] U.S. Cl. ............ 257/192; 257/194; 257/280; 257/285; 257/287
[58] Field of Search .................. 257/408, 336, 257/344, 345, 192, 194, 280, 285, 287

[56]         References Cited

U.S. PATENT DOCUMENTS

| 4,962,054 | 10/1990 | Shikata | 257/285 X |
| 5,124,770 | 6/1992 | Umemoto | 257/192 |
| 5,182,218 | 1/1993 | Fujihira | 437/22 |

FOREIGN PATENT DOCUMENTS

| 61-222177 | 10/1986 | Japan | 257/285 |
| 62-79673 | 4/1987 | Japan | 257/285 |
| 63-124471 | 5/1988 | Japan . | |
| 63-281470 | 11/1988 | Japan . | |
| 1012579 | 1/1989 | Japan | 257/285 |
| 1208867 | 8/1989 | Japan | 257/285 |

OTHER PUBLICATIONS

English Abstract for Japanese Patent No. 63-124471.
English Abstract for Japanese Patent No. 63-281470.

*Primary Examiner*—William Mintel
*Attorney, Agent, or Firm*—Beveridge, Degrandi, Weilacher & Young, L.L.P.

[57]         ABSTRACT

It is an object of the present invention to provide a structure of a field effect transistor, which effectively suppresses a leakage current from a source/drain region to a substrate side without increasing a parasitic capacitance, and a method of manufacturing the same. According to the present invention, when an LDD structure is to be constituted by forming, in a semiconductor substrate, an active layer of a first conductivity type, a heavily doped layer of the first conductivity type, which is separated from the active layer by a predetermined distance and has a high impurity concentration; and an intermediate concentration layer of the first conductivity type, which is formed between the active layer and the heavily doped layer and has an impurity concentration lower than that of the heavily doped layer, regions of a second conductivity (these regions are converted into depletion layers upon contact with the corresponding regions of the first conductivity), which cover the entire bottom portion of the corresponding region are formed.

6 Claims, 7 Drawing Sheets

FIELD EFFECT TRANSISTOR WITH LIGHTLY DOPED DRAIN REGIONS

BACKGROUND OF THE INVENTION

1. Field of the Invention

The present invention relates to a field effect transistor having an LDD (Lightly Doped Drain) structure and usable as a high-frequency device or the like and, more particularly, to the special structure of the field effect transistor and a method of manufacturing the same.

2. Related Background Art

A field effect transistor (to be referred to as an FET hereinafter) consisting of a compound semiconductor such as GaAs is a very promising device as a very high-speed or high-frequency device or the like. To improve the high-frequency characteristics of such an FET, generally, the gate length is shortened. On the other hand, as the gate length becomes shorter, a short channel effect is generated, resulting in a degradation in device characteristics. This short channel effect is particularly remarkable in an FET having a structure in which the source and drain regions are formed to be self-aligned with respect to the gate electrode. A leakage current that flows into a semi-insulating semiconductor substrate between the adjacent source/drain regions is considered as the main cause.

To suppress this short channel effect, an FET using an LDD structure is disclosed in, e.g., U.S. Pat. Nos. 5,182,218 and 4,962,054, and Japanese Patent Laid-Open Nos. 63-281470 and 63-124471.

In the LDD structure, an n-type channel layer and an n$^+$-type region are separated from each other, and an n$^-$-type region having a lower impurity concentration than the n$^+$-type region is formed therebetween, thereby constituting source and drain regions by the n$^+$- and n$^-$-type regions. With this LDD structure, an electric field strength of the drain region is relaxed at the end portion thereof to suppress a leakage current that flows into a portion under the n-type channel layer from the source/drain region.

Of the above prior arts, U.S. Pat. No. 4,962,054 and Japanese Patent Laid-Open No. 63-124471 disclose an FET having a p-type region under an n-type region constituting the LDD structure. When the p-type region is provided, a potential barrier is formed between the n-type region and the p-type region, thereby suppressing the leakage current flowing from the source/drain region to the portion under the n-type channel layer.

In particular, in the FET disclosed in the above U.S. Pat. No. 4,962,054, the bottom portions of all n-type regions constituting the LDD structure are covered with a single p-type region. In the FET disclosed in the above Japanese Patent Laid-Open No. 63-124471, each bottom portion of the n-channel layer and the n$^-$-type region is covered with a p-type buried layer having a low impurity concentration while the bottom portion of the n$^+$-type region is covered with a p-type region having a high impurity concentration.

SUMMARY OF THE INVENTION

As described above, in an FET having a p-type region on the lower side of the LDD structure, the impurity concentration and thickness of the p-type buried layer formed immediately under the n-type channel layer are normally determined on the basis of fully depleted conditions for converting the p-type buried layer into a depletion layer by the p-n junction potential difference between the n-type channel layer and the p-type buried layer. The impurity concentration of the p-type buried layer adjacent under the n-type channel layer must be low not to increase the parasitic capacitance of the FET. Similarly, the thickness of the p-type buried layer is also preferably made small to prevent an increase in parasitic capacitance.

Therefore, the impurity concentration and thickness of the p-type buried layer adjacent under the n-type channel layer are set such that a sufficient potential barrier is formed with respect to the n-type channel layer while minimizing the parasitic capacitance.

In the relationship between the p-type buried layer and a source/drain region, however, the sufficient potential barrier cannot be formed between the p-type buried layer and the source/drain region because the source/drain region has a high impurity concentration. In other words, the impurity concentration and thickness of the p-type buried layer adjacent under this n-type channel layer are set on the basis of the relationship with respect to the n-type channel, so the leakage current from the source/drain region into the substrate cannot be sufficiently prevented.

On the other hand, even when a heavily doped p-type region is additionally formed adjacent under the source/drain region in order to sufficiently prevent the leakage current from the source/drain region into the substrate, the heavily doped p-type region must be sufficiently separated from the n-type channel layer to suppress the short channel effect. This means that the p-type buried layer adjacent under the n-type channel layer must prevent the leakage current from not only the n-type channel layer but also the n$^-$-type region formed between the n-type channel layer and the n$^+$-type region. In other words, the impurity concentration and thickness of the p-type buried layer adjacent under the n-type channel layer must be set on the basis of the relationship with respect to not only the n-type channel layer but also the n$^-$- and n$^+$-type regions.

As described above, an increase in parasitic capacitance in the FET becomes a problem in making a high-speed FET and degrades the high-frequency characteristics of the FET. To effectively suppress the short channel effect without increasing the parasitic capacitance of the FET, an advanced manufacturing technique is required to set the impurity concentration and thickness of the p-type region formed under the n-type region constituting the LDD structure.

It is an object of the present invention to provide a structure of a field effect transistor, which effectively suppresses a leakage current flowing from a source/drain region under an active layer side without increasing a parasitic capacitance, and a method of manufacturing the same.

According to the present invention, when an LDD structure is to be constituted by forming, in a semiconductor substrate, an active layer of a first conductivity type, a heavily doped region (a first region) of the first conductivity type, which is separated from the active layer by a predetermined distance and has a high impurity concentration, and a lightly doped region (a second region) of the first conductivity type, which is formed between the active layer and the heavily doped region and has an impurity concentration lower than that of the heavily doped layer, regions of a second conductivity type (these regions are converted into depletion layers upon contact with the corresponding regions of the first conductivity type), which cover the entire bottom portion of the corresponding region are formed.

More specifically, a field effect transistor according to the present invention has an LDD structure, as shown in FIG. 1. This FET has an active layer 3 of a first conductivity type, which is in Schottky contact with a gate electrode 17 formed on a top surface 1a of a semiconductor substrate 1 and having a predetermined gate length L, and a buried layer 4 of a second conductivity type, which is located under the active layer 3 while being in direct contact with the active layer 3, and has a predetermined thickness $T_0$. This active layer 3 is adapted to form a channel when a predetermined voltage is applied to the gate electrode 17. Source and drain regions separated from each other by the active layer 3 and the buried layer 4 are formed in the semiconductor substrate 1 and extend from the top surface 1a toward a rear surface 1b on the opposite side of the top surface 1a. Each of the source and drain regions is constituted by a first region 100 having a high impurity concentration, and at least one second region 200 surrounding the first region 100, partially existing between the active layer 3 and the first region 100, and having an impurity concentration lower than that of the first region 100.

In particularly, the first region 100 includes a first upper region 7 of the first conductivity type and a first lower region 8 of the second conductivity type. The first upper region 7 extends from the top surface 1a of the substrate 1 toward the rear surface 1b of the substrate 1, and the first lower region 8 is located under the first upper region 7 while being in direct contact with the first upper region 7 and covering the entire bottom surface of the region 7. The second region 200 includes a pair of a second upper region 210 of the first conductivity type and a second lower region 220 of the second conductivity type. The second upper region 210 extends from the top surface 1a toward the rear surface 1b, and the second lower region 220 is located under the second upper region 210 while being in direct contact with the second upper region 210 and covering the entire bottom surface of the region 210.

The second regions 200 including a plurality of intermediate concentration regions each consisting of a pair of an n-type region (upper intermediate concentration region) and a p-type region (lower intermediate concentration region) may be formed, as shown in FIG. 2. In this case, in the second region 200, the impurity concentrations of the plurality of lower intermediate concentration regions corresponding to the upper intermediate concentration regions sequentially decrease from the first region 100 toward the active layer 3, and thereby a concentration profile of the second region 200 decreases in a stepwise manner from the first region 100 to the active layer 3, as shown in FIG. 10. In addition, depths D (intervals from the top surface 1a of the substrate 1 to the bottom portions of the lower intermediate concentration regions 10, 12) the second region 200 may be decreased in a stepwise manner from the first region 100 toward the active layer 3.

As shown in FIG. 1, the impurity concentrations and thicknesses $T_0$, $T_1$, and $T_2$ of the buried layer 4, the second lower region 220 of the second region 200, and the first lower region 8 of the first region 100 are set to establish depletion in contact with the corresponding n-type regions. Even when the plurality of intermediate concentration regions of the second regions 200 are formed, as shown in FIG. 2, each lower intermediate concentration region is set to an optimal value to establish depletion while being in contact with the corresponding upper intermediate concentration region which pairs up with the lower intermediate concentration region.

The first method of forming the second region 200 is as follows. First and second impurity ions are implanted at predetermined doses from an ion implantation region R (an ion implantation window formed in a dummy gate) defined by the dummy gate (mask) formed on the top surface of the substrate 1 and having a predetermined area into the substrate at predetermined acceleration voltages, thereby forming the first region 100 consisting of a pair of the first upper region (first conductivity type) and the first lower region (second conductivity type). Thereafter, the surface of the dummy gate is narrowed to increase the area of the ion implantation region. The first and second impurity ions are implanted at predetermined doses from the spread region into the substrate 1 at predetermined acceleration voltages, thereby forming the second region 200 consisting of a pair of the second upper region 210 (first conductivity type) and the second lower region 220 (second conductivity type). If a plurality of intermediate concentration regions 10, 12 are to be formed as the second region 200, the first region 100 is formed at a position separated from the region where the gate electrode is to be formed on the top surface of the substrate by a predetermined distance, and thereafter, the process of narrowing the dummy gate to increase the area of the ion implantation region R and the process of implanting the ions are repeatedly executed, thereby forming the plurality of intermediate concentration regions as the second region 200 around the first region 100.

A change in area of the ion implantation region, which is performed to form the plurality of intermediate concentration regions, is performed by the first method such that the surface of the dummy gate is narrowed to increase the area of the opening portion R of the dummy gate (ion implantation window). In addition to the first method, the second method may be applied in which a side wall for limiting the ion implantation region is formed on the gate electrode which is formed in advance, thereby sequentially decreasing the area of the region. According to the second method, the second region 200 is formed from a side close to the active layer 3. After the second region 200 is formed, the first region 100 is formed.

In the first method, the dose of the first impurity ions for forming the lower intermediate concentration regions 10, 12 is sequentially decreased every time the area of the ion implantation region increases. The acceleration voltage for the first impurity ions is sequentially decreased every time the area of the ion implantation region increases.

To the contrary, in the second method, the dose of the first impurity ions for forming the lower intermediate concentration regions 10, 12 is sequentially increased every time the area of the ion implantation region decreases. The acceleration voltage for the first impurity ions is sequentially increased every time the area of the ion implantation region decreases.

According to the field effect transistor of the present invention, different regions of the second conductivity type are formed under the active layer, the first upper region, and the second upper region (including the plurality of upper intermediate concentration regions), all of which are of the second conductivity type, in correspondence with the upper regions of the first conductivity type. A potential barrier is formed between the upper regions of the first conductivity type, including the active layer, and the lower regions of the second conductivity layer, including the buried layer. Since the lower regions of the second conductivity type are formed in correspondence with the active layer, the first upper region respectively, and the second upper region, the impurity concentrations and thicknesses $T_0$, $T_1$, and $T_2$ of the lower regions of the second conductivity type can be individually adjusted such that a potential barrier having a sufficient level is formed at an interface between each pair of the upper and lower regions. For this reason, the leakage current flowing from the lower surfaces of the first upper region and the second upper region into the semiconductor substrate is suppressed by the potential barrier, so that the short channel effect can be effectively suppressed. When the impurity concentrations and thicknesses $T_0$, $T_1$, and $T_2$ of each lower region are adjusted to establish full depletion, an increase in parasitic capacitance can be effectively suppressed.

In addition, according to the method of manufacturing the field effect transistor of the present invention, two impurities of different conductivity types are doped using the same dummy gate or gate electrode as a mask, thereby forming double structures each consisting of regions of different conductivity types, including the active layer 3 and the buried layer 4 adjacent under the active layer, the second upper region 210 and the second lower region 220, which constitute the second region 200, and the first upper region 7 and the first lower region 8, which constitute the first region 100. Since the plurality of lower regions are formed in different processes, the impurity concentrations and thicknesses of the lower regions can be individually adjusted. For this reason, an optimal potential barrier can be formed between the upper region and the lower region of each of the regions 100 and 200, thereby effectively suppressing the short channel effect.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
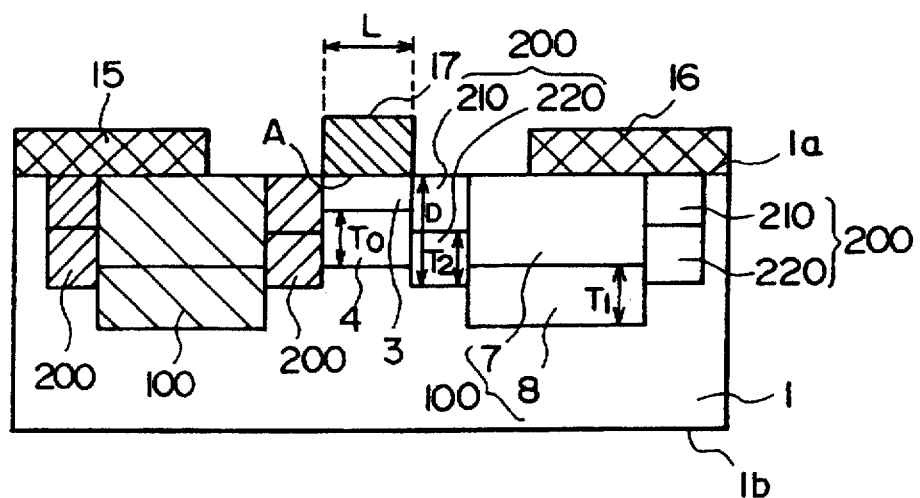
FIG. 1 is a sectional view schematically showing the structure of a field effect transistor according to the present invention.
Figure 2:
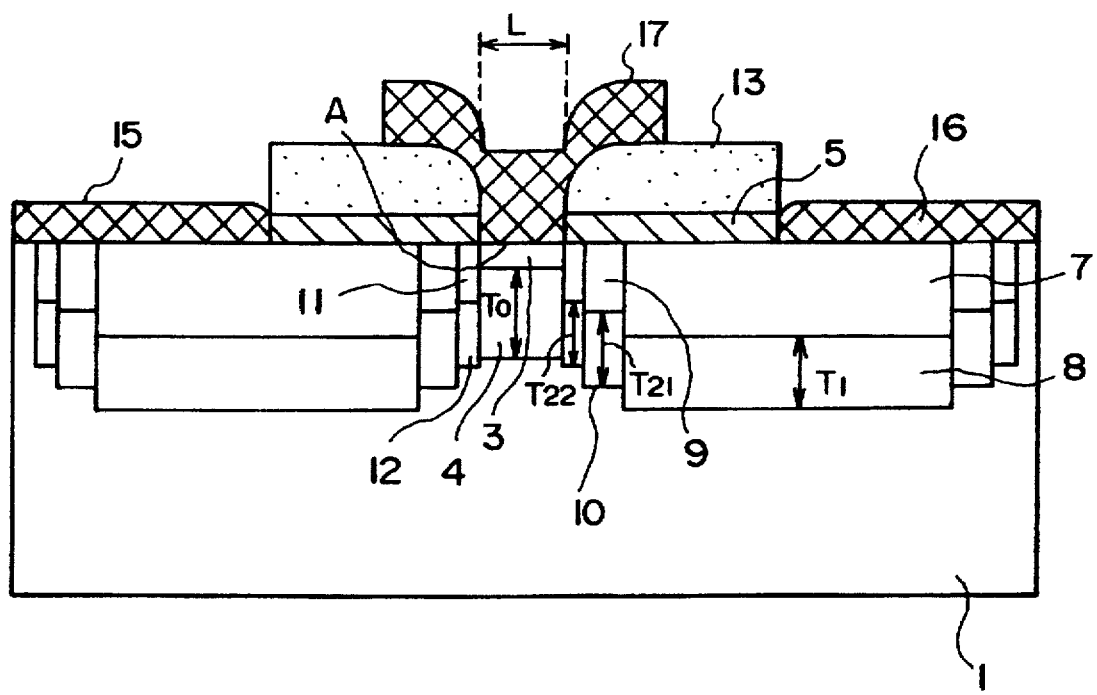
FIG. 2 is a sectional view showing the structure of a field effect transistor manufactured by the first manufacturing method according to the present invention.
Figure 3:
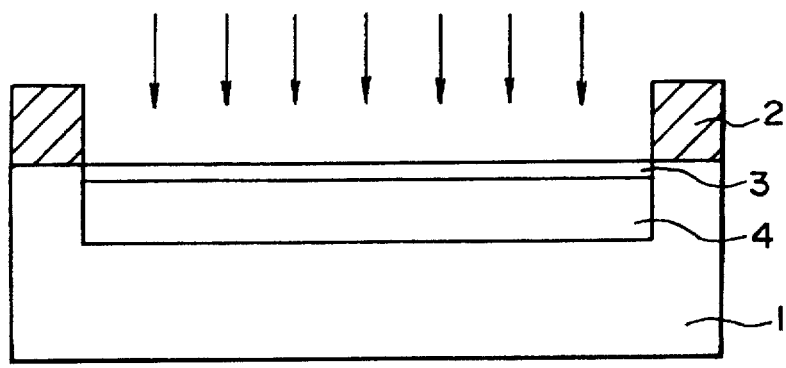
FIGS. 3 to 8 are sectional views showing steps in manufacturing the field effect transistor shown in FIG. 2 by the first manufacturing method.
Figure 4:
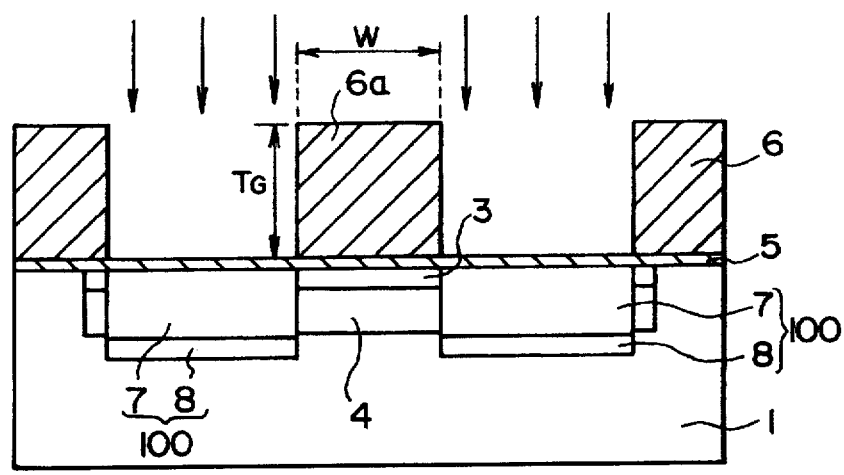
Figure 5:
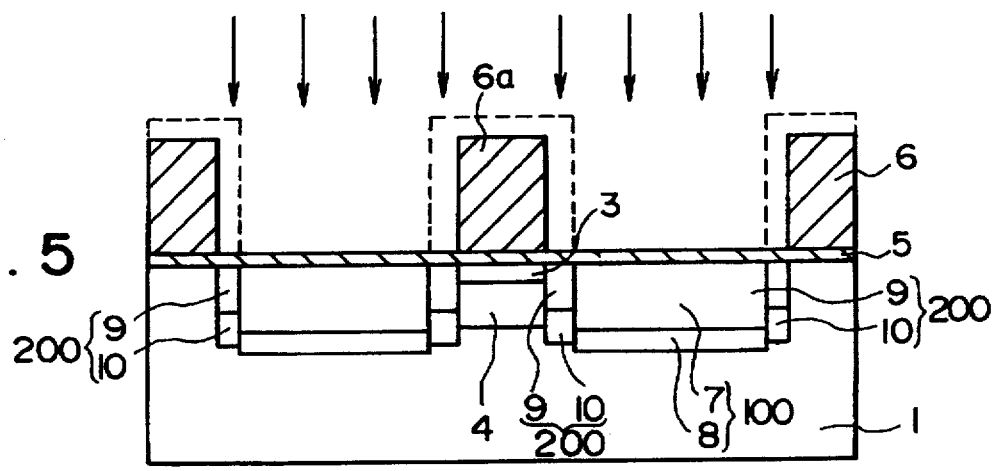
Figure 6:
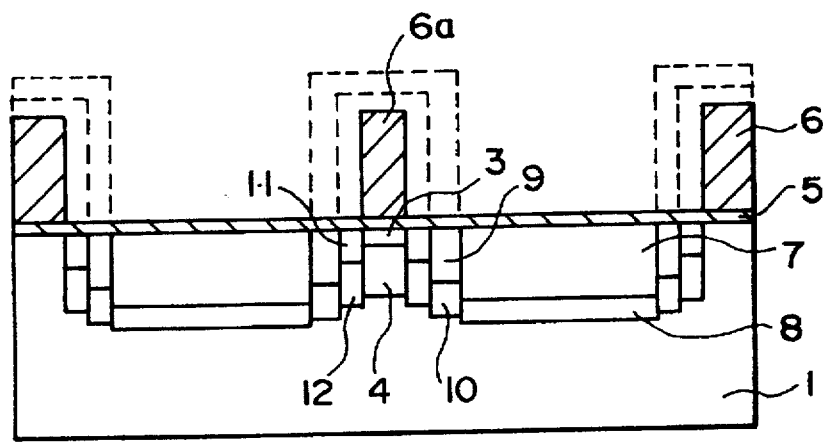

An embodiment of the present invention will be described below with reference to the accompanying drawings. FIG. 2 is a sectional view showing the structure of a field effect transistor according to this embodiment. As shown in FIG. 2, an n-type active layer 3 is formed on a gate formation region A of the top surface 1a of a GaAs semiconductor substrate 1 having semi-insulating properties. A p-type buried layer 4 is formed under the active layer 3. A gate electrode 17 is formed on the active layer 3 while being in Schottky contact with the active layer 3. An $n^+$-type first upper region 7 (heavily doped region) and a p-type first lower region 8 under the first upper region 7 are formed as a first region 100 on the source/drain formation region of the top surface 1a of the semiconductor substrate 1. A source electrode 15 and a drain electrode 15 are formed on the first upper regions 7 while being in ohmic contact with the first upper regions 7.

The field effect transistor of this embodiment applies an LDD structure in which, between the active layer 3 and the first upper region 7 of the first region 100, a first upper intermediate concentration region 9 (as an n-type second upper region) having an impurity concentration lower than that of the first upper region 7 is formed on the first upper region side, and a second upper intermediate concentration region 11 (as an n-type second upper region) having an impurity concentration lower than that of the first upper intermediate concentration region 9 is formed on the active layer side. The impurity concentrations and thicknesses $T_1$, $T_{21}$ and $T_{22}$ decrease in the order of the first upper region 7, the first upper intermediate concentration region 9 and the second upper intermediate concentration region 11. A first lower intermediate concentration region 10 (as a p-type second lower region) is formed under the first upper intermediate concentration region 9. A second lower intermediate concentration region 12 (as a p-type second lower region) having an impurity concentration lower than that of the first lower intermediate concentration region 10 is formed under the second upper intermediate concentration region 11.

The impurity concentrations and thicknesses $T_0$, $T_1$, $T_{21}$, and $T_{22}$ of the p-type regions 4, 8, 10, and 12 located under the n-type regions 3, 7, 9, and 11, respectively, are set to form an optimal potential barrier with respect to the corresponding n-type region on the upper side, and at the same time, maintain full depletion. A leakage current from the lower surfaces of the n-type first upper region and the n-type second upper regions 9 and 11 can be suppressed by this potential barrier, thereby preventing the characteristics from being degraded by the short channel effect. When the p-type regions 4, 8, 10, and 12 are in p-n contact with the corresponding n-type regions 3, 7, 9, and 11 to establish perfect depletion, an increase in parasitic capacitance is suppressed.

FIGS. 3 to 8 and FIG. 9 are views showing steps of the first manufacturing method of the field effect transistor according to this embodiment. In the first step, a photoresist 2 is spin-coated on the GaAs semiconductor substrate 1 having semi-insulating properties. This photoresist 2 is patterned by photolithography and selectively removed from the active layer formation region. Using the patterned photoresist 2 as a mask, $Be^+$ ions as first impurity ions are implanted at an acceleration voltage of 70 keV and a dose of $6.0 \times 10^{11}$ /cm². Using the same mask, $Si^+$ ions as second impurity ions are implanted at an acceleration voltage of 30 keV and a dose of $3.0 \times 10^{12}$ /cm². With the ion implantation, the n-type active layer 3 serving as a channel is formed on the top surface of the semiconductor substrate 1, and the p-type buried layer 4 is formed under the active layer 3 (see FIG. 3).

After the photoresist 2 for forming the active layer is removed, a silicon nitride film 5 (SiN film) having a thickness of 800 Å is formed on the entire top surface of the semiconductor substrate 1 by PE-CVD method (Plasma Enhanced-Chemical Vapor Deposition). This SiN film 5 functions as a surface protective film. In the second step, a photoresist 6 is spin-coated on the SiN film 5 and patterned by normal photolithography. In this patterning process, the photoresist 6 on the source and drain formation regions is removed, and at the same time, a dummy gate 6a for forming a gate electrode is formed. In this embodiment, this dummy gate 6a is formed as a rectangular parallelopiped having a pattern thickness $T_G$ of 1.6 μm and a pattern width W of 1.0 μm. Note that the pattern width W is larger than a gate length L. In the third step of forming the first region 100, ion implantation is performed twice using the photoresist 6 as a mask. In this ion implantation, $Be^+$ ions at a dose of $1.0 \times 10^{12}$ ions/$cm^2$ are accelerated at a voltage of 100 keV and implanted into the active layer 3 and the buried layer 4 through the SiN film 5. Subsequently, $Si^+$ ions at a dose of $4.0 \times 10^{13}$ /$cm^2$ are accelerated at a voltage of 120 keV and implanted into the active layer 3 and the buried layer 4. With the two ion implantation operations, the $n^+$-type first upper region 7 and the p-type first lower region 8, which constitute the first region 100, are formed (see FIG. 4).

In the fourth step, plasma etching using $O_2$ plasma is performed to reduce the outer size of the dummy gate 6a. This size reduction is isotropically performed using O* radicals, so that the shape of the rectangular parallelopiped is maintained. Each side wall of the dummy gate 6a is etched by 0.15 μm. Thereafter, in the fifth step, ion implantation is performed twice using the reduced dummy gate 6a as a mask. In this ion implantation, $Be^+$ ions at a dose of $8.0 \times 10^{11}$ /$cm^2$ are accelerated at a voltage of 90 keV and implanted into the active layer 3 and the buried layer 4. Subsequently, $Si^+$ ions in a dose of $6.0 \times 10^{12}$ /$cm^2$ are accelerated at a voltage of 90 keV and implanted into the active layer 3 and the buried layer 4. With the two ion implantation operations, the n-type region 9 (as a first upper intermediate concentration region) having an impurity concentration lower than that of the n-type first upper region 7 and the p-type region 10 (as a first lower intermediate concentration region) having an impurity concentration lower than that of the p-type first lower region 8 are formed (see FIG. 5).

Figure 9:
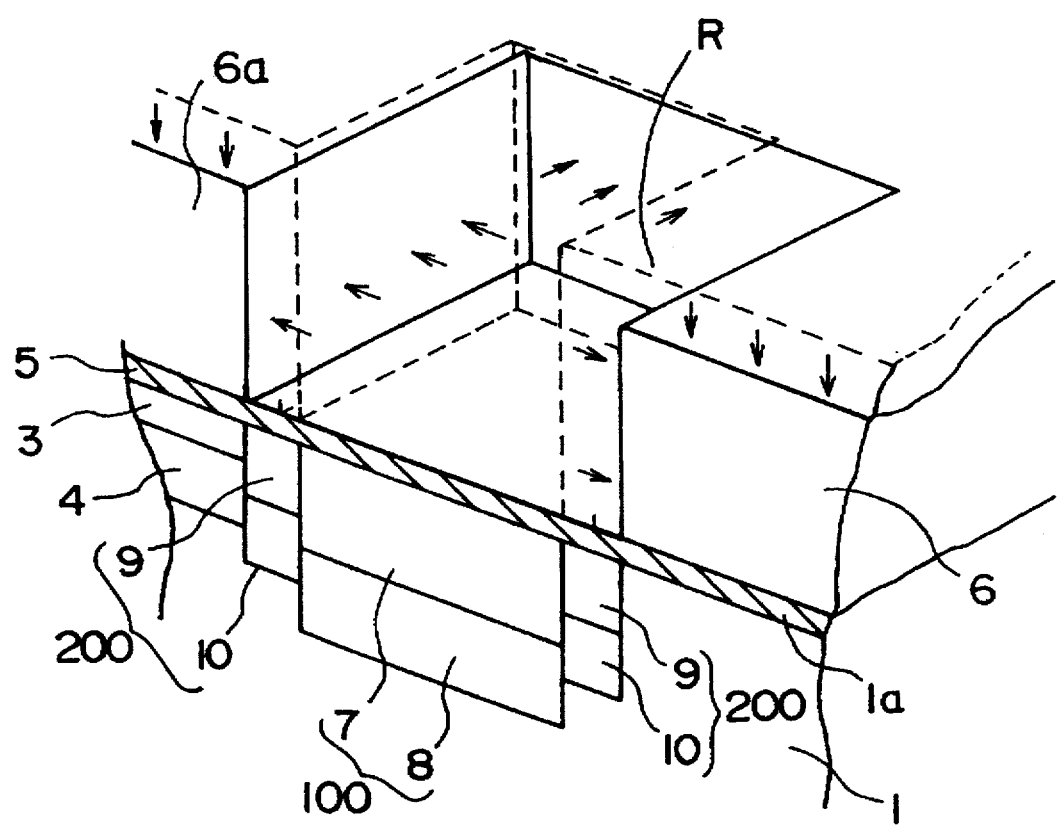
FIG. 9 is a perspective view of the top surface of a substrate so as to explain the manufacturing steps shown in FIGS. 4 to 6.
Figure 10:
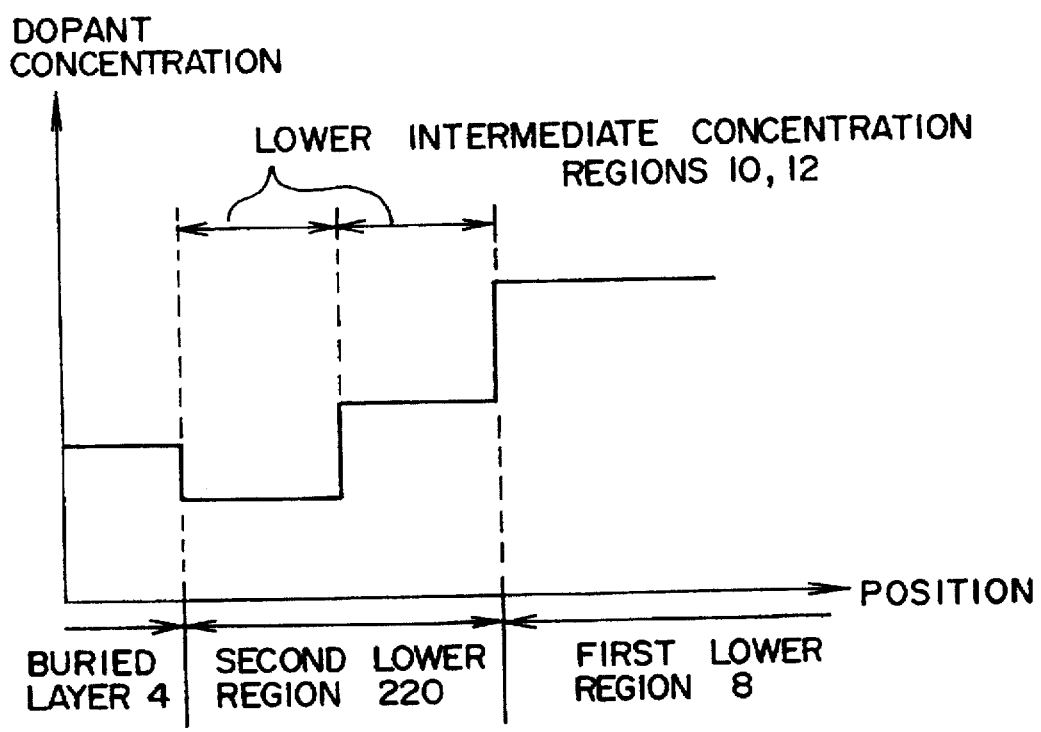
FIG. 10 is a dopant concentration profile so as to mainly explain a plurality of intermediate concentration regions of the FET shown in FIG. 2.
Figure 11:
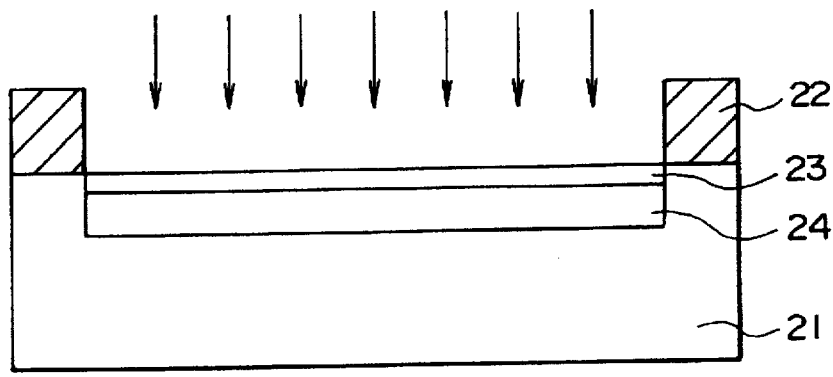
FIGS. 11 to 15 are sectional views showing steps of the second manufacturing method according to the present invention.
Figure 12:
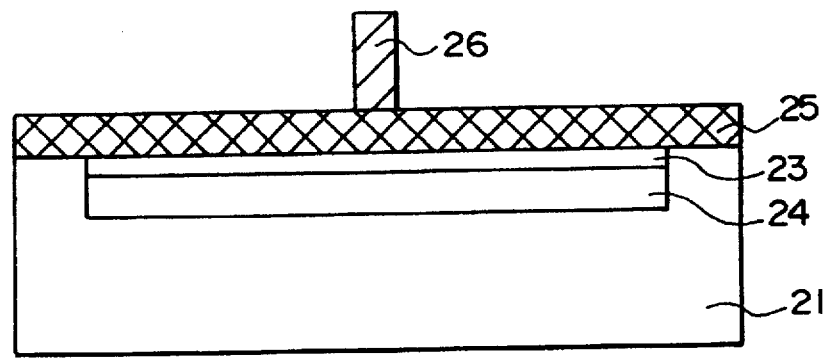
Figure 13:
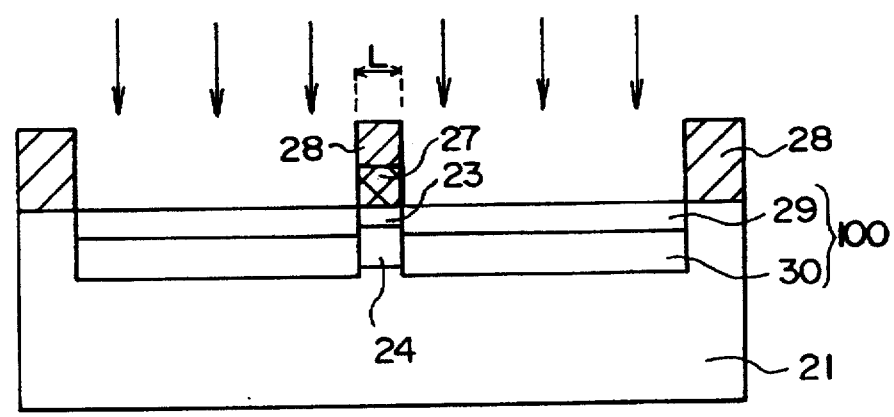
Figure 14:
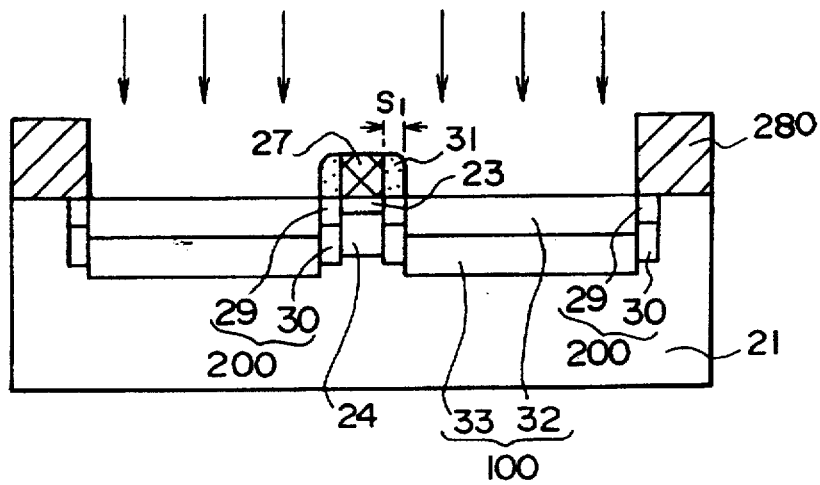
Figure 15:
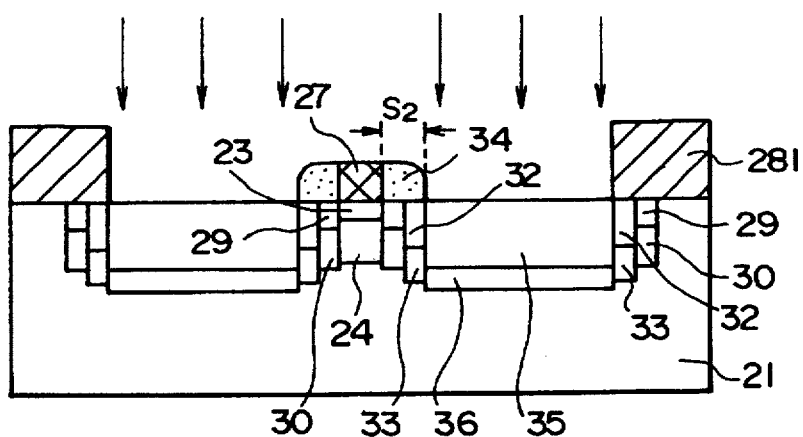

FIG. 9 is a perspective view of the upper portion of the FET in the fourth step. As is apparent from FIG. 9, when the surface of the photoresist (dummy gate) is etched, the area of the opening portion of a window (ion implantation region R) increases. Therefore, a second region 200 is formed to surround the first region 100.

Subsequently, the fourth step is performed again, in which plasma etching using $O_2$ plasma is performed. The reduced dummy gate 6a is further isotropically reduced by O* radicals (see FIG. 9). Each side wall of the dummy gate 6a is etched by 0.1 μm. Thereafter, the fifth step is performed again, in which ion implantation is performed twice using the dummy gate 6a as a mask. In this ion implantation, $Be^+$ ions at a dose of $4.0 \times 10^{11}$ /$cm^2$ are accelerated at a voltage of 70 keV and implanted into the active layer 3 and the buried layer 4 through the SiN film 5. Subsequently, $Si^+$ ions at a dose of $4.0 \times 10^{12}$ /$cm^2$ are accelerated at a voltage of 50 keV and implanted into the active layer 3 and the buried layer 4. With the two ion implantation operations, the n-type region 11 (as a second upper intermediate concentration region) having an impurity concentration lower than that of the n-type region 9 and the p-type region 12 (as a second lower intermediate concentration region) having an impurity concentration lower than that of the p-type region 10 are formed (see FIG. 6).

Figure 7:
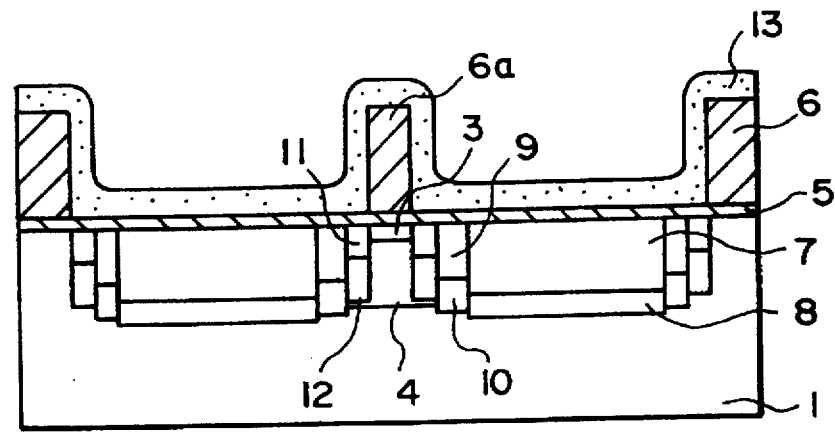
Figure 8:
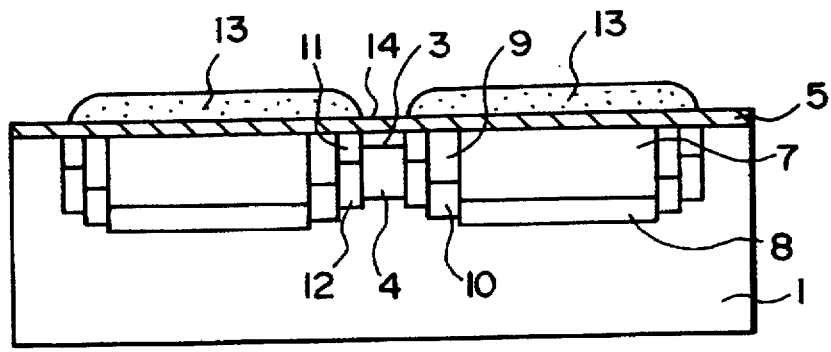

In the sixth step, $SiO_2$ is deposited on the entire top surface of the substrate by CVD using a microwave electron cyclotron resonance (ECR) plasma CVD or sputtering to form an insulating film 13 having a thickness of 3,000 Å (see FIG. 7). After slight etching using buffer hydrofluoric acid (HF) is performed so that the $SiO_2$ film on the side wall of the dummy gate 6a is removed and the photoresist 6a is exposed, the reduced dummy gate 6a is lifted off, and an inverted pattern 14 (a region A where the gate electrode 17 is to be formed) is formed where the dummy gate 6a was present once (see FIG. 8). In this state, annealing is performed to activate the impurity ions implanted into the semiconductor substrate 1.

The ohmic electrode pattern (gate electrode 17) is formed by normal photolithography. In the seventh step, RIE (Reactive Ion Etching) is performed using the ohmic electrode pattern as a mask, thereby selectively removing the SiN film 5 and the insulating film 13 from the source and drain regions. An ohmic metal AuGe/Ni is deposited, lifted off, and alloyed, thereby forming the source electrode 15 and the drain electrode 16, both of which are in ohmic contact with the exposed first upper regions 7. In the eighth step, a gate electrode pattern is formed by normal photolithography. RIE is performed using the gate electrode pattern as a mask, thereby removing the SiN film 5 from the inverted pattern 14 (the region A where the gate electrode 17 is to be formed). A gate metal Ti/Pt/Au is deposited and lifted off, thereby forming the gate electrode 17 in Schottky contact with the exposed active layer 3. The end portion of the gate electrode 17 overlaps the insulating film 13. With the above processes, the field effect transistor of this embodiment having the structure shown in FIG. 2 is completed.

FIGS. 11 to 15 are sectional views showing steps of the second manufacturing method of the field effect transistor according to this embodiment. In the first step, a photoresist 22 is spin-coated on a GaAs semiconductor substrate 21 having semi-insulating properties. This photoresist 22 is patterned by photolithography and selectively removed from an active layer formation region. Using the patterned photoresist 22 as a mask, $Be^+$ ions are implanted at an acceleration voltage of 70 keV and a dose of $6.0 \times 10^{11}$ /$cm^2$. Using the same mask, $Si^+$ ions are implanted at an acceleration voltage of 30 keV and a dose of $3.0 \times 10^{12}$ /$cm^2$. With the ion implantation, an active layer 23 serving as a channel is formed on the top surface of the semiconductor substrate 21, and a p-type buried layer 24 is formed under the active layer 23 (see FIG. 11).

After the photoresist 22 for forming the active layer is removed, WSi as a refractory metal is deposited on the entire top surface of the semiconductor substrate 21 to a thickness of 3,000 Å by dc sputtering, thereby forming a WSi layer 25. A photoresist 26 is spin-coated on the WSi layer 25 and patterned by normal photolithography to remove the photoresist 26 outside the gate formation region (see FIG. 12).

Reactive ion etching (RIE) is performed using the patterned photoresist 26 as a mask to remove the WSi layer 25 outside the gate formation region. The photoresist 26 on the gate region is removed to form a gate electrode 27 having a gate length L of 0.5 μm and a gate width of 0.3 μm (second step). A photoresist 28 is spin-coated on the active layer 23 and the gate electrode 27 and patterned by normal photolithography. In this patterning process, the photoresist 28 on the source and drain formation regions is removed. In the third step, ion implantation is performed twice using the gate electrode 27 and the photoresist 28 as a mask. In this ion implantation, $Be^+$ ions at a dose of $4.0 \times 10^{11}$ /$cm^2$ are accelerated at a voltage of 50 keV and implanted into the active layer 23 and the buried layer 24. Subsequently, $Si^+$ ions at a dose of $4.0\times10^{12}$ /cm$^2$ are accelerated at a voltage of 30 keV and implanted into the active layer 23 and the buried layer 24. With the two ion implantation operations, an n-type upper region 29 (as a second upper intermediate concentration region) and a p-type lower region 30 (a second lower intermediate concentration region) are formed (see FIG. 13).

In the fourth step, after the photoresist 28 is removed, an $SiO_2$ film is formed on the entire surface of the gate electrode 27 and the second upper region 29 by thermal CVD. The $SiO_2$ film is etched by vertical RIE to form side walls 31 having a thickness $S_1$ (0.1 µm) on the side surfaces of the gate electrode 27. Again, the photoresist 280 is coated the top surface of the substrate 21, and an ion implantation window of a predetermined size is formed in the photoresist 280. In the fifth step, ion implantation is performed twice using the gate electrode 27, the photoresist 280, and the side walls 31 as a mark. In this ion implantation, $Be^+$ ions at a dose of $8.0\times10^{11}$ /cm$^2$ are accelerated at a voltage of 70 keV and implanted into the active layer 23 and the buried layer 24. Subsequently, $Si^+$ ions at a dose of $6.0\times10^{12}$ /cm$^2$ are accelerated at a voltage of 70 keV and implanted into the active layer 23 and the buried layer 24. With the two ion implantation operations, an n-type upper region 32 (as a first upper intermediate concentration region) having an impurity concentration higher than that of the n-type upper region 29 and a p-type lower region 33 (as a first lower intermediate concentration region) having an impurity concentration lower than that of the p-type lower region 30 are formed (see FIG. 14).

Therefore, the n-type region 32 and the p-type region 33, which are formed in this fifth step, is formed to be surrounded by the n-type region 29 and the p-type region 30, which are formed in the above third step.

Subsequently, the fourth step is performed again, in which an $SiO_2$ film is formed on the entire surface of the gate electrode 27 and the upper intermediate concentration region 32 by thermal CVD after the photoresist 280 is removed. The $SiO_2$ film is etched by vertical RIE, thereby forming side walls 34 having a thickness $S_2$ (0.25 µm) on the side surfaces of the gate electrode 27 ($S_1<S_2$). A new ion implantation opening for forming the first region 100 is formed in the photoresist 281 coated on the entire top surface of the substrate 21. The fifth step is performed again, in which ion implantation is performed twice using the gate electrode 27, the photoresist 28, and the side walls 34 as a mark. In this ion implantation, $Be^+$ ions at a dose of $4.0\times10^{13}$ /cm$^2$ are accelerated at a voltage of 80 keV and implanted into the active layer 23 and the buried layer 24. Subsequently, $Si^+$ ions at a dose of $4.0\times10^{13}$ /cm$^2$ are accelerated at a voltage of 100 keV and implanted into the active layer 23 and the buried layer 24. With the two ion implantation operations, an n-type first upper region 35 having an impurity concentration higher than that of the n-type upper region 32 and a p-type first lower region 36 having an impurity concentration higher than that of the p-type lower region 33 are formed (see FIG. 15).

Figure 16:
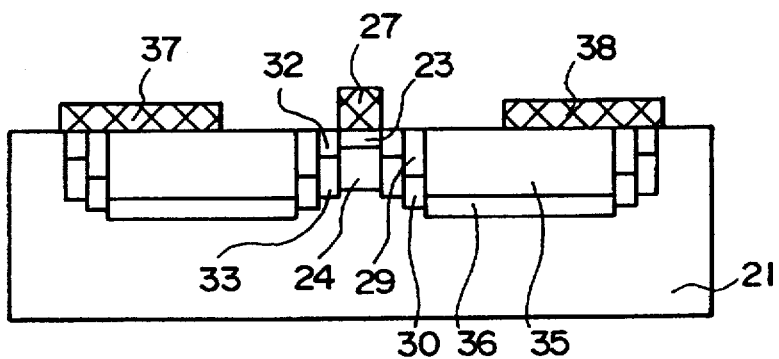
FIG. 16 is a sectional view showing the structure of the field effect transistor manufactured by the second manufacturing method shown in FIGS. 11 to 15.

In the sixth step, the photoresist 281 and the side walls 34 are removed, and thereafter, an ohmic electrode pattern is formed on the top surface of the substrate 21 by normal photolithography. In accordance with the ohmic electrode pattern, a source electrode 37 and a drain electrode 38, which are in ohmic contact with the exposed heavily doped regions 35, are formed (see FIG. 16). With the above processes; the field effect transistor of this embodiment is completed.

The present invention is not limited to the above embodiment, and various changes and modifications can also be made. In this embodiment, the two second upper regions 9 and 11 are formed between the n-type active layer 3 and the first upper region 7 as an n-type heavily doped region. However, only one or three or more layers may also be formed. Even when the number of second upper regions changes, an n-type second lower region is formed for each second upper region. The dummy gate 6a is formed of a photoresist, and the material is not necessarily limited to this. Any other material may also be used as far as it has properties allowing isotropic reduction by plasma etching and capable of preventing transmission of implanted ions. The material of the insulating film 13 from which the inverted pattern 14 is formed is not limited to $SiO_2$, either. Any other insulating material may be used as far as it has a large etching selectivity ratio with respect to the material of the dummy gate 6a. The semiconductor substrate 1 or 21 is formed of GaAs. However, a substrate consisting of InP or InGaAs may also be used.

As has been described above in detail, according to the field effect transistor of the present invention, lower regions of another conductivity type are formed in correspondence with the active layer, the first upper region, and the second upper region, which constitute an LDD structure. For this reason, the impurity concentrations and the thicknesses $T_0$, $T_{21}$, $T_{22}$, and $T_1$ of these lower regions can be adjusted such that a potential barrier with an optimal level is formed between the regions. Therefore, the leakage current flowing from the lower surface of the first upper region into the semiconductor substrate can be suppressed by the potential barrier, thereby effectively suppressing the short channel effect.

In addition, according to the method of manufacturing a field effect transistor of the present invention, two regions of the different conductivity types can be easily formed by implanting two impurities of the different conductivity types from the top surface of the substrate while using the same dummy gate or gate electrode as a mask. A potential barrier for suppressing the leakage current is formed at the boundary between these regions, so that the short channel effect can be effectively suppressed.

As described above, the present invention can effectively suppress the short channel effect, so that it can be effectively applied as the basic structure of a GaAs MESFET having a gate length of 0.5 µm or less, which is excellent in very-high-speed and high-frequency characteristics.

A field effect transistor of the present invention is also applied to a p-type GaAs MESFET. In this case, the channel layer and the upper portions of the source and drain regions is of p-type, and the buried layer or the like is of n-type.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.220161/1994 filed on Sep. 14, 1994 is hereby incorporated by reference.

What is claimed is:

1. A field effect transistor having a Lightly Doped Drain structure, comprising:

a semiconductor substrate;

a gate electrode formed on a top surface of said semiconductor substrate;

an active layer of a first conductivity type, which is formed in said substrate while being in Schottky contact with said gate electrode;

a buried layer of a second conductivity type, which is located under said active layer while being in direct contact with said active layer;

source and drain regions extending from said top surface of said substrate toward a rear surface of said substrate in an opposite side of said top surface and separated from each other by said active layer, said active layer forming a channel for current flow between said source region and said drain region; and ohmic electrodes respectively formed on said source and drain regions;

each of said source and drain regions having:

a first region having a high impurity concentration and including a first upper region of the first conductivity type, said first upper region extending from said top surface of said substrate toward said rear surface of said substrate, and a first lower region of the second conductivity type, said first lower region being located under said first upper region while being in direct contact with and covering an entire bottom surface of said first upper region, and a second region having a portion between said active layer and said first region and having an impurity concentration lower than that of said first region, said portion including a second upper region of the first conductivity type, said second upper region extending from said top surface of said substrate toward said rear surface of said substrate, and a second lower region of the second conductivity type, said second lower region being located under said second upper region while being in direct contact with and covering an entire bottom surface of said second upper region.

2. A transistor according to claim 1, wherein said second region comprises a plurality of intermediate concentration regions each having a portion between said active layer and said first region, and wherein said portion of each intermediate concentration region includes an second upper intermediate concentration region of the first conductivity type, said upper intermediate concentration region extending from said top surface of said substrate toward said rear surface of said substrate, and a lower intermediate concentration region of the second conductivity type, said lower intermediate concentration region being located under said upper intermediate concentration region while being in direct contact with and covering an entire bottom surface of said upper intermediate concentration region.

3. A transistor according to claim 2, wherein depths from said top surface of said semiconductor substrate to bottom portions of said plurality of intermediate concentration regions decrease in a stepwise manner from said first region toward said active layer.

4. A transistor according to claim 2, wherein, in said second regions has a dopant concentration profile that decreases in a stepwise manner from said first region toward said active layer.

5. A transistor according to claim 1, wherein a dopant concentration and a thickness of said second lower region of said second region is optimized so that a sufficient potential barrier is formed at an interface between said second lower region and said second upper region without increasing a parasitic capacitance of said field effect transistor.

6. A transistor according to claim 2, wherein a dopant concentration and a thickness of said lower intermediate concentration lower region of said each intermediate concentration region are set so that a sufficient potential barrier is formed at an interface between said lower intermediate concentration region and said corresponding upper intermediate concentration region without increasing a parasitic capacitance of said field effect transistor, said corresponding upper intermediate concentration region being located on and in contact with said lower intermediate concentration region.

* * * * *